(12) United States Patent
Park

(10) Patent No.: US 7,847,551 B2
(45) Date of Patent: Dec. 7, 2010

(54) METHOD AND MAGNETIC RESONANCE SYSTEM TO EXCITE NUCLEAR SPINS IN A SUBJECT

(75) Inventor: Jaeseok Park, Seoul (KR)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/499,176

(22) Filed: Jul. 8, 2009

(65) Prior Publication Data

US 2010/0013479 A1  Jan. 21, 2010

(30) Foreign Application Priority Data

Jul. 8, 2008  (DE)  ........................ 10 2008 032 155

(51) Int. Cl.
*G01V 3/00* (2006.01)
(52) U.S. Cl. ...................................... 324/309; 324/307
(58) Field of Classification Search ......... 324/300–322, 324/407–445
See application file for complete search history.

(56) References Cited

U.S. PATENT DOCUMENTS

| | | | |
|---|---|---|---|
| 4,947,119 A * | 8/1990 | Ugurbil et al. ............... | 324/307 |
| 6,518,757 B1 | 2/2003 | Speier | |
| 7,375,520 B2 * | 5/2008 | Nezafat et al. ............... | 324/307 |
| 2005/0024052 A1 * | 2/2005 | Bendall et al. ............... | 324/307 |
| 2006/0244447 A1 | 11/2006 | Michaeli et al. | |
| 2006/0253015 A1 | 11/2006 | Nezafat et al. | |
| 2009/0230957 A1 * | 9/2009 | Park ........................... | 324/307 |

OTHER PUBLICATIONS

"A Reduced Power Selective Adiabatic Spin-Echo Pulse Sequence," Conolly et al, Magnetic Resonance in Medicine, vol. 18, No. 1 (1991) pp. 28-38.
"Improved Background Suppression for 3D-MRCP Using T2-Prep," Busse et al, Proc. Int. Soc. Mag. Reson. Med., vol. 14 (2006) p. 392.
"Variable-Rate Selective Excitation," Conolly et al, J. of Magnetic Resonance, vol. 78 (1998) pp. 440-458.
"Practical Implementation of Optimized Tissue-Specific Prescribed Signal Evolutions for Improved Turbo-Spin-Echo Imaging," Mugler et al, Proc. Int. Soc. Mag. Reson. Med., vol. 11 (2003) p. 203.
"Multislice Imaging with Adiabatic Pulses Using Transverse Hadamard Encoding," De Graaf et al, J. of Magnetic Resonance, Series B 113 (1996), pp. 97-101.

* cited by examiner

*Primary Examiner*—Brij B Shrivastav
(74) *Attorney, Agent, or Firm*—Schiff Hardin LLP

(57) ABSTRACT

In a method and system to generate an excitation in an examination subject to acquire magnetic resonance signals from a region of the examination subject, basic magnetic field is generated, an adiabatic half-passage (AHP) pulse is radiated to generate a transverse magnetization in the subject, and at least one first and one second adiabatic full-passage (AFP) pulse is radiated to generate a slice-selective rephasing of the transverse magnetization. The time interval between the first adiabatic half-passage pulse and the first adiabatic full-passage pulse is at least 37 ms, and the time interval between the first adiabatic full-passage pulse and the second adiabatic full-passage pulse is at least 75 ms.

20 Claims, 4 Drawing Sheets

METHOD AND MAGNETIC RESONANCE SYSTEM TO EXCITE NUCLEAR SPINS IN A SUBJECT

BACKGROUND OF THE INVENTION

1. Field of the Invention

The present invention concerns a method to excite nuclear spins in an excitation in an examination subject so as to acquire magnetic resonance signals from a region of the examination subject, as well as a magnetic resonance system for implementation of the method.

2. Description of the Prior Art

Magnetic resonance tomography is a method in widespread use for acquiring medical image data of a subject to be examined. The subject to be examined is brought into an optimally homogeneous static magnetic field ($B_0$ field). To acquire image data, magnetic gradient fields are applied and electromagnetic radio-frequency (RF) pulses are radiated that excite nuclear spins processing around the magnetic fields. The magnetic flux density of the RF pulses is often designated with $B_1$. Given an excitation with RF pulses, the direction of the magnetization (which is originally aligned parallel to the $B_0$ field) is tilted by a predetermined angle (flip angle) relative thereto. The flip angle depends both on the radiation duration of the RF pulse and on the $B_1$ field strength. For example, given a flip angle of 90°, a transverse magnetization (perpendicular to the $B_0$ field) can be generated that exhibits a decay that is subsequently acquired as a magnetic resonance signal. Consequently, to generate qualitatively high-grade image data, it is desirable to obtain an optimally uniform deflection of the magnetization across the slice of the subject to be examined.

The transverse magnetization decays by means of spin-spin relaxation during a decay time or relaxation time $T_2$. The decay of the transversal magnetization with $T_2$, however, occurs only in an ideal homogeneous magnetic field. In a real magnetic field, the transverse magnetization decays with the time constant $T_2^*$ due a certain degree of inhomogeneity of the real magnetic field. The $T_2^*$ relaxation time is normally significantly shorter than the $T_2$ relaxation time. Nevertheless, in order to obtain a signal that is dominated by $T_2$, spin echo methods are used, wherein a 180° refocusing pulse slews the transverse magnetization. The transversal magnetization consequently re-phases and generates a spin echo signal.

Different $T_2$ relaxation times for different tissue or fluids can be used in order to establish a contrast between these signal sources. For example, a fluid with longer $T_2$ relaxation time is imaged with high contrast in magnetic resonance cholangiopancreaticography (MRCP). In order to acquire a high signal of the fluid, strongly $T_2$-weighted multi-echo sequences are used, for example turbo spin echo sequences (TSE). These TSE sequences conventionally include a number of 180° refocusing pulses with constant, high refocusing flip angles in order to cause signals to be acquired essentially only from regions of an examined person that exhibit long $T_2$ relaxation times. The conventional MRCP imaging method consequently results in a high energy injection into the examined person. Since signals with short $T_2$ times are also acquired at the beginning of the echo sequence, background signals, that are caused by blood and fat and can interfere with a diagnosis, often remain in the image data. The use of selected radio-frequency (RF) pulses for fat saturation also leads to an incomplete suppression of signals of body fat due to $B_0$ and $B_1$ inhomogeneities. The $B_1$ amplitude additionally varies spatially, particularly in a high field, which leads to spatially-dependent, inhomogeneous signal intensities across the field of view. Due to the necessary use of a pulse sequence with high flip angles, a high power of the magnetic resonance system is furthermore required for MRCP imaging. Disadvantages of a conventional MRCP are thus a high energy injection into human tissue, an incomplete suppression of background signals, and the influence of $B_1$ inhomogeneities.

Due to the strong $T_2$ weighting, an MRCP imaging requires many refocusing pulses with large flip angles. In order to reduce the energy injection, the number of refocusing pulses could be reduced or the refocusing flip angles could be reduced. However, these measures reduce the acquisition efficiency of magnetic resonance signals and the signal intensity acquired from a fluid.

In order to reduce the background signals that are caused by blood and fat, it was proposed by Busse et al. in "Improved Background Suppression for 3D-MRCP using T2-Prep", Proc. Intl. Soc. Mag. Reson. Med. 14 (2006), Page 392, to delay a data acquisition after an excitation or to implement a separate, short $T_2$ preparation before an excitation. However, this method does not solve the problem of the high energy injection, since a large number of refocusing pulses with large flip angles is required.

SUMMARY OF THE INVENTION

An object of the present invention is to provide a method for generation of an excitation in an examination subject to acquire magnetic resonance signals, that achieves acquisition of magnetic resonance signals with an optimally low background signal, a low energy injection into the examination subject, and a reduction of the influence of magnetic field inhomogeneities. Furthermore, it is an object of the present invention to provide a magnetic resonance system for implementation of such a method.

According to a first aspect of the present invention, a method for generation of an excitation in an examination subject to acquire magnetic resonance signals from a region of the examination subject has the following steps to the examination subject is placed in a basic magnetic field. An adiabatic half-passage pulse is radiated to generate a transverse magnetization, and at least one first and one second adiabatic full-passage pulse is radiated to produce a slice-selective rephasing of the transverse magnetization. According to the invention, the time interval between the first adiabatic half-passage pulse and the first adiabatic full-passage pulse is at least 37 ms. Furthermore, the time interval between the first adiabatic full-passage pulse and the second adiabatic full-passage pulse is at least 75 ms. Due to the use of adiabatic pulses, such an excitation is generally less sensitive with regard to $B_0$ or $B_1$ magnetic field inhomogeneities. Due to the designation of the time intervals between the pulses, the excitation in the regions of the examination subject with short $T_2$ relaxation times has already decayed while a rephasing of the transversal magnetization occurs in regions with longer $T_2$ relaxation times, and thus an excitation remains. A good contrast between unwanted structures (for example blood and fat) and desired structures (for example a specific fluid) can thus be obtained with such an excitation sequence.

In an embodiment of the present invention, after the second adiabatic full-passage pulse at least one third and one fourth adiabatic full-passage pulse are radiated. The time intervals between the second adiabatic full-passage pulse and the third adiabatic full-passage pulse, as well as between the third adiabatic full-passage pulse, and the fourth adiabatic full-passage pulse is at least 75 ms. Signals from tissues over a wide range of $T_2$ relaxation times can be nearly entirely suppressed with such an excitation sequence, for example. A large $T_2$ weighting can in particular be achieved by a relaxation during the radiation of the adiabatic pulse occurring in addition to a relaxation between the pulses. In a further embodiment, the time interval between two successive adiabatic full-passage pulses is at least 100 ms, advantageously at least 150 ms. A strong $T_2$ weighting can be achieved with such echo times, such that a fluid with a long $T_2$ relaxation time can be imaged with high contrast with a subsequent imaging sequence. In another embodiment of the present invention, the time interval between successive adiabatic full-passage pulses is established such that the transverse magnetization after radiation of the last adiabatic full-passage pulses has already significantly decayed in regions of the examination subject that are primarily composed of tissue. By contrast, the transverse magnetization re-phases in regions of the examination subject that are primarily composed of fluid, such that a spin echo magnetic resonance signal can subsequently be acquired from the regions of the examination subject that primarily comprise fluid. A good contrast between the fluid and the tissue is thus achieved.

In a further embodiment of the invention, the phase of the transverse magnetization that is excited by the adiabatic half-passage pulse is calculated using a mathematical description of the adiabatic half-passage pulse. For example, a numerical simulation of the Bloch equations for the adiabatic half-passage pulse can be used for this purpose. Furthermore, an RF phase of the adiabatic half-passage pulse is set using the calculated phase of the transversal magnetization, such that a predetermined phase of the magnetization is present after the radiation of the adiabatic half-passage pulse and the adiabatic full-passage pulses. Such an adjustment of the phases of the transversal magnetization can be used in order to satisfy a phase relation regarding subsequently radiated refocusing pulses. Such a phase relation can be the Carr-Purcell-Meiboom-Gill (CPMG) condition, for example.

In an additional embodiment of the invention, the radiated adiabatic full-passage pulses are modulated according to a VERSE method. Such a VERSE (Variable Rate Selective Excitation) modulation is described in detail in Conolly et al., "Variable-Rate Selective Excitation", Journal of Magnetic Resonance 78, Pages 440-458 (1988). The disclosure of this printed document is incorporated herein by reference. In a VERSE modulation, the maximum $B_1$ amplitude of an adiabatic full-passage pulse (AFP) pulse is reduced. An AFP pulse can thereby be modulated in that the field amplitudes of the pulse are limited by adaptation of a radiation duration to a predetermined value given a corresponding field amplitude. For example, a maximum field amplitude ($B_1$) value can be established, wherein amplitude values of the original adiabatic full-passage pulse that lie above this maximum value are reduced to this maximum value, and the radiation duration at the corresponding amplitude is extended as compensation. The same rotation of the magnetization can thus be obtained. For example, an identical excitation can be obtained in that the radiation is conducted for twice as long with half the field strength. The maximum $B_1$ amplitude can thus be significantly reduced by using such a modulation, whereby the introduced RF energy is reduced as well as the loading of the RF amplifier.

In another embodiment of the present invention, no acquisition of magnetic resonance signals for an imaging ensues during the radiation of the adiabatic half-passage (AHP) pulse and the adiabatic full-passage (AFP) pulse. For example, tissue or regions of the examination subject with relatively short $T_2$ times can still emit magnetic resonance signals after a radiation of the AHP pulse or the first AFP pulse, which can lead to an increase of the background signals. It is thus advantageous to not acquire any magnetic resonance signals during the radiation of the AHP pulses and the AFP pulses since magnetic resonance signals of regions with short $T_2$ time can thus be further suppressed.

According to a further embodiment, the method can include a successive radiation of multiple refocusing pulses to generate a rephasing of the transversal magnetization and acquisition of spin echo magnetic resonance signals between successive refocusing pulses. The refocusing pulses can be part of a turbo spin echo sequence for imaging, for example. The use of such a spin echo sequence in connection with the method according to the invention for generation of an excitation is advantageous since strongly $T_2$-weighted magnetic resonance signals can be acquired with low background signals. For example, the phase of the refocusing pulses and/or the phase of the adiabatic half-passage pulse can be set such that a CPMG condition is satisfied. The fulfillment of a CPMG condition is advantageous since deviations from predetermined flip angles for the refocusing pulses do not add, and thus every second spin echo signal can exhibit the correct signal amplitude, for example.

According to a further embodiment the refocusing pulses can be part of a spin echo sequence and can cause a slewing of the transversal magnetization with predetermined flip angles, wherein the refocusing pulses are respectively set such that the flip angle changes according to predetermined values over the duration of the spin echo sequence. For example, with such a control of the flip angles over the duration of the spin echo sequence, only a minimal RF energy is introduced into the examination subject. For example, low flip angle values can be predetermined so that the radiation duration or maximum field amplitude of the refocusing pulses can be reduced. For example, for this purpose a method can be used as described by Mugler et al., "Practical Implementation of Optimized Tissue-Specific Prescribed Signal Evolutions for Improved Turbo-Spin-Echo Imaging", Proc. Intl. Soc. Mag. Reson. Med. 11 (2003), Page 203. The variation of the flip angles over the duration of the spin echo sequence can be adapted depending on the application field. A maximum magnetic resonance signal can thus be realized with minimal energy introduction.

In another embodiment of the present invention, the values predetermined for the flip angles decay exponentially over the duration of the spin echo sequence for a predetermined number of refocusing pulses, wherein the provided values maintain a predetermined value for a predetermined number of following refocusing pulses or rise to a predetermined value. Such a progression of the flip angles can provide sufficiently high flip angles at the start of the spin echo sequence while supplying lower flip angles in the middle part of the echo sequence for a lower energy introduction, for example. A variation of the flip angles over the spin echo sequence that is configured in such a way can be used for an MRCP imaging, for example.

According to a further embodiment of the invention, the spin echo magnetic resonance signals in the phase coding direction are acquired with a partial Fourier acquisition. Energy injection thus can be further reduced.

In another embodiment, spin echo magnetic resonance signals for central k-space lines are acquired following the excitation with adiabatic pulses. For example, a $B_1$ insensitivity can be further improved via an initial acquisition of the central k-space lines. For example, although $B_1$ inhomogeneity effects can occur in the refocusing pulses, the central region of k-space is less affected by a change of a $B_1$ amplitude, whereby an initial acquisition of the central k-space lines is advantageous.

The generation of an excitation by radiation of the pulses as described in the preceding can be part of an imaging sequence to show a fluid, for example, in particular part of a magnetic resonance cholangiopancreaticography imaging sequence. Since, in such a case, the fluid can exhibit high $T_2$ times, an application of the method described in the preceding is particularly advantageous since a high contrast can this be obtained between the fluid and surrounding tissue, which enables a presentation of a bile duct system with high contrast, for example.

According to a further aspect of the present invention, a magnetic resonance system is provided for generation of an excitation in an examination subject to acquire magnetic resonance signals from a region of the examination subject. The magnetic resonance system has a magnet for application of a primary magnetic field to a region of the examination subject; an RF coil arrangement to radiate RF pulses into a region of the examination subject; and a control unit. The control unit controls the radiation of RF pulses such that an adiabatic half-passage pulse for generation of a transversal magnetization as well as at least one first and one second adiabatic full-passage pulse is radiated to generate a slice-selective rephasing of the transversal magnetization, wherein the time interval between the first adiabatic half-passage pulse and the first adiabatic full-passage pulse is at least 37 ms, and wherein the time interval between the first adiabatic full-passage pulse and the second adiabatic full-passage pulse is at least 75 ms. Such an embodiment of a magnetic resonance system is advantageous since it is suitable for a subsequent acquisition of magnetic resonance signals with high contrast of regions with long $T_2$ relaxation time relative to regions with short $T_2$ relaxation time, and can achieve a good suppression of background signals and a small introduction of RF energy. The magnetic resonance system is advantageously designed such that it operates according to one or more of the embodiments of the method as described above.

According to an additional aspect of the present invention, a computer-readable medium, encoded with the programming instructions, is provided that causes ay or all of the embodiments described above to be executed by a computer system. For example, the electronically-readable data medium can be used in a computer system that is functionally connected with a magnetic resonance system.

DESCRIPTION OF THE PREFERRED EMBODIMENTS

Figure 1:
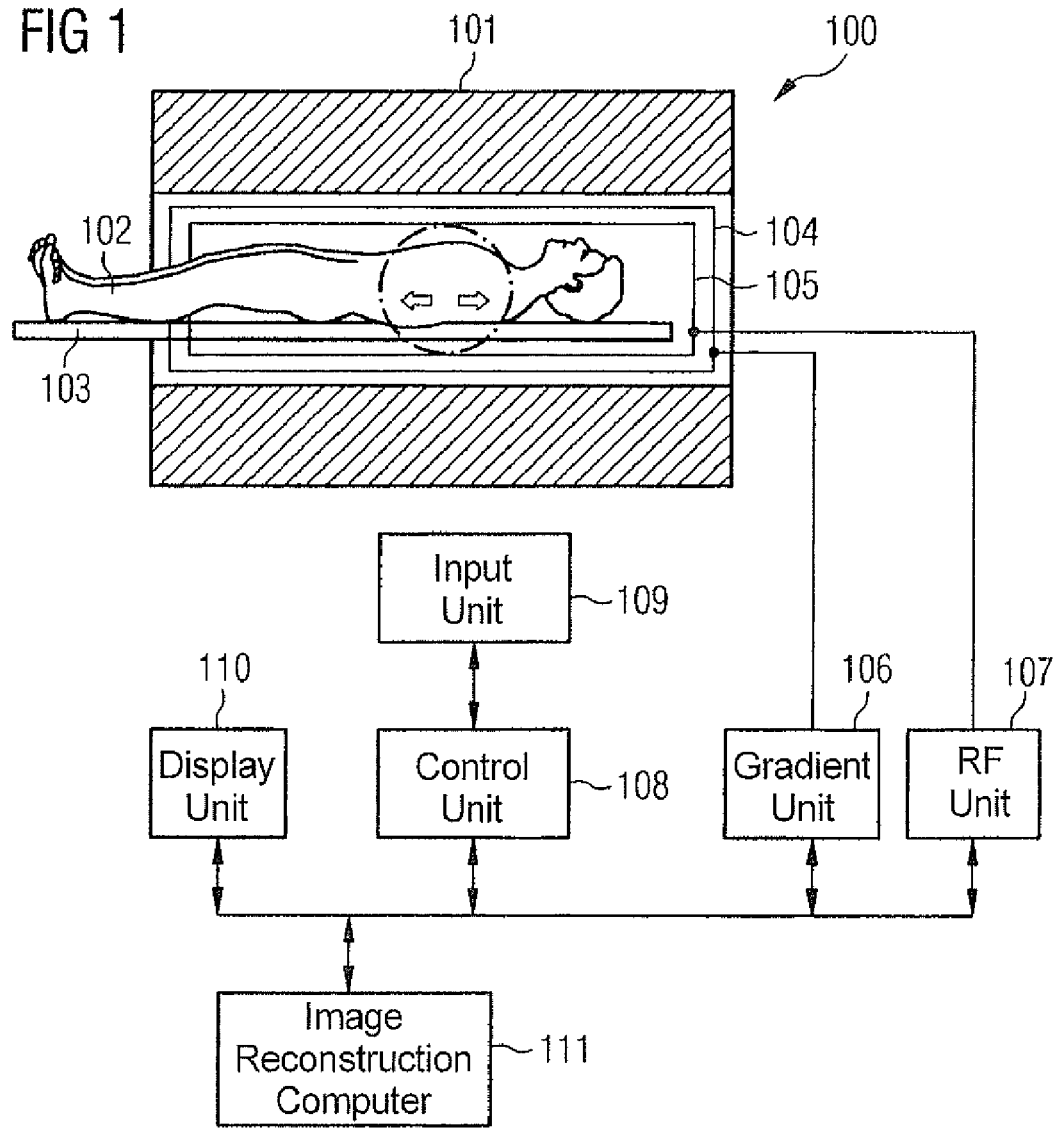
FIG. 1 is a schematic representation of a magnetic resonance system according to an embodiment of the invention.

FIG. 1 schematically shows a magnetic resonance system 100 with which the phase position of a magnetization induced by an adiabatic radio-frequency pulse can be determined, for example for a subsequent acquisition of image data with a multi-echo magnetic resonance sequence. Such a magnetic resonance system has a magnet 101 for generation of a polarization field $B_0$. In the example shown here, the examination subject is an examination person 102 who is arranged on a bed 103. As is schematically shown by arrows, the bed can be driven into the magnet 101 and moved in this. The magnetic resonance system furthermore possesses a gradient system 104 for generation of magnetic field gradients that are used for the imaging and spatial coding. A radio-frequency coil arrangement 105 that radiates a radio-frequency field into the examined person 102 in order to deflect the magnetization from the equilibrium state is provided to excite the polarization resulting in the basic magnetic field. A gradient unit 106 is provided to control the magnetic field gradients and an RF unit 107 is provided to control the radiated RF pulses. A control unit 108 centrally controls the magnetic resonance system; the selection of the imaging sequences likewise ensues in the control unit 108. An operator can select a sequence protocol via an input unit 109 and can made additional adjustments to the magnetic resonance system, for example predetermine imaging parameters. A display unit 110 serves to display acquired magnetic resonance signals or reconstructed image data as well as the adjusted parameters and other presentations required for operation of the magnetic resonance system. Furthermore, a computer 111 is provided that, for example, serves for reconstruction of image data from acquired magnetic resonance signals.

Numerical simulations of Bloch equations can also be conducted with such a computer, for example in order to calculate the phase of the transversal magnetization that is generated by an AFP pulse or in order to calculate predetermined values for flip angles of refocusing pulses. The general mode of operation of a magnetic resonance system is known to those skilled in the art, such that a detailed description of the basic components need not be provided herein.

An acquisition unit of the magnetic resonance system 100 can include the gradient unit 106, the gradient system 104, the RF unit 107, the radio-frequency coil arrangement 105 and the magnet 101, for example. Additional embodiments of the acquisition unit are naturally conceivable, for example the use of special head coils, chest coils and other local coil arrangements for radio-frequency transmission and reception operation, the use of different gradient coil sets for the gradient system, and the use of various magnets 101 (for example permanent magnets, normally conducting magnets or superconducting magnets).

The control unit 108 controls the gradient unit 106 and the RF unit 107 such that an adiabatic half-passage (AHP) pulse and two following adiabatic full-passage (AFP) pulses are radiated into a region of the examination subject that is to be examined. The time interval between the radiated pulses is thereby selected such that the excitation in regions of the examination subject with short $T_2$ has already decayed after the radiation of the AHP pulse and the AFP pulses while a transversal magnetization generated by the AHP pulse rephases in regions with long $T_2$ relaxation time. The excitation generated in this way is available for subsequent sequences for acquisition of magnetic resonance signals. For example, the decay of the magnetization generated via the excitation within the scope of a spin echo sequence is acquired with the aid of the radio-frequency coil arrangement 105 as well as the RF unit 107.

Magnetic field gradients can be applied during these procedures via activation of the gradient unit 106. For example, during the radiation of the AFP pulses, slice-selection gradients can be applied so that these cause a slice-selective rephasing of the magnetization. Furthermore, phase coding gradients and frequency coding gradients can be applied before or during the acquisition of magnetic resonance signals, and spoiler or crusher gradients can be applied to diffuse a remaining residual magnetization and the decay signal connected with this (free induction decay, FID).

Control unit 108 is now designed such that it induces the radiation of one AHP pulse and, for example, two or four following AFP pulses by means of RF unit 107 and RF coil arrangement 105. The AHP pulses and the AFP pulses can be radiated using predetermined RF pulse signal curves, for example. The pulse shape is thereby determined such that the AHP pulse induces an essentially transversal magnetization of nuclear spins (i.e. deflects the magnetization by a 90° angle) while the AFP pulses are designed such that the magnetization experiences a deflection by essentially 180°. Furthermore, the adiabatic full-passage pulse pulses are designed for a slice-selective excitation, and a slice-selection gradient is applied by means of the gradient unit 106 during the radiation. The design of the adiabatic excitation pulses can be calculated in computer 111, for example. For example, a numerical simulation of Bloch equations for the AHP pulse can ensue in order to determine an initial radio-frequency phase for the AHP pulse with which the AHP pulse should be radiated. For example, this is important for a use of the application caused within the scope of a multi-spin echo sequence, as is described in more detail in the following.

180° pulses for refocusing are often used in multi-echo magnetic resonance sequences, for example the turbo spin echo sequence. If the deflection of the magnetization does not amount to a full 180° (which can rarely be achieved), the deviation is cumulative, which can lead to significant variations of the amplitude of acquired magnetic resonance signals during the turbo spin echo sequence. This can be avoided by satisfying the Carr-Purcell-Meiboom-Gil (CPMG) condition. The phase of 180° refocusing pulses is hereby offset by 90° against, for example, a 90° excitation pulse. A cumulative deviation is thus avoided. Given radiation of the RF pulses under this condition, all even echoes show the correct amplitude while the odd echoes exhibit a somewhat reduced amplitude.

Through the numerical simulation of the Bloch equations for the AHP pulse in the computer 111, the RF phase for the AHP pulse can now be determined such that a CPMG condition can be satisfied in the subsequent radiation of refocusing pulses within the scope of a multi-echo magnetic resonance sequence. Furthermore, it should be noted that the AFP pulses are radiated in pairs by means of the control unit 108 and the RF unit 107 such that a non-linear phase variation over a selective slice that is typically induced by the first AFP pulse of the pair is exactly compensated by means of the second AFP pulse. A nearly constant phase is thus generated within the excited slice.

The time intervals between AHP pulse and following AFP pulses are now selected such that a very strong $T_2$ weighting is obtained. For this the echo time between the AHP pulse and the following 360° AFP pulses is expanded such that the excitation in the form of the transversal magnetization has significantly decayed in areas with shorter $T_2$ while an excitation remains in regions with longer $T_2$, for example the fluid of the bile system. Control unit 108 is now furthermore designed such that a multi-echo magnetic resonance sequence (for example a turbo spin echo sequence) is radiated following such an excitation sequence. Flip angle and radiation duration of the refocusing pulses of such a sequence can be calculated in computer 111, for example. Control unit 108 controls the radiation of the calculated refocusing pulses and the acquisition of spin echo magnetic resonance signals between the refocusing pulses. Furthermore, control unit 108 can induce the implementation of additional such sequences that consist of an adiabatic excitation sequence and subsequent refocusing pulses for the same slice or for additional slices. Computer 111 can subsequently translate magnetic resonance signals that are acquired from the examined slices into image data. Image data from multiple slices can then subsequently be assembled by computer 111 into three-dimensional image data. Using the described imaging sequence with adiabatic excitation sequence, such image data exhibit a high contrast between (for example) fluid-filled ducts of the bile duct system and surrounding tissue. A high contrast relative to blood and adipose tissue is also achieved.

Figure 2:
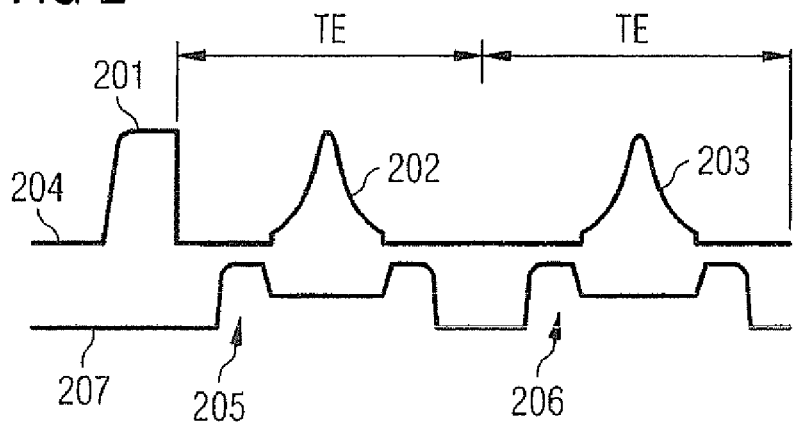
FIG. 2 is a schematic representation of an embodiment of an RF excitation according to the invention that is composed of one adiabatic half-passage pulse and two adiabatic full-passage pulses.

FIG. 2 is a schematic representation of an exemplary excitation sequence that comprises an AHP pulse 201 and two AFP pulses 202 and 203. An adiabatic radio-frequency pulse is generally a pulse that possesses an amplitude modulation and a frequency or phase modulation. An adiabatic pulse is normally designed to excite a common precession of all hydrogen spins of a sample. The excitation of the nuclear spins is thereby essentially $B_1$-insensitive beyond a certain threshold of the field strength $B_1$. A common excitation of the nuclear spins thus can be achieved even given the presence of magnetic field inhomogeneities.

The sequence of the RF pulses is shown on axis 204. The AHP pulse 201 causes a rotation of the magnetization by 90°. During the radiation of the adiabatic half-passage pulse 201, no gradient is applied and the excitation ensues in a non-slice-selective manner. Axial gradients 205 and 206 are applied during the radiation of the AFP pulses 202 and 203. These are shown on axis 207 and are often also designated as slice-selection gradients. Adiabatic full-passage pulses cause a rotation of the magnetization by essentially 180°. This excitation of the magnetization thereby ensues in a slice-selective manner. Frequency-selective adiabatic pulses can be obtained via a limitation of the pulse bandwidth, for example. Hyperbolic secant (sech) pulses (~1/cosh x) can be used as slice-selective adiabatic full-passage pulse inversion pulses. The application of the slice-selection gradients 205 and 206 leads to different Larmor frequencies of the excited spins, whereby again only spins from a predetermined slice are excited due to the frequency-selectivity of the adiabatic pulses 202 and 203. The 180° AFP pulses 202 and 203 lead to a spin echo signal after a time duration TE or, respectively, 2TE, for example. In general, the point in time at which a spin echo can be observed depends on the time interval between the excitation pulse (AHP) and the refocusing pulse (here AFP 202 or, respectively, AFP 203). The assembled adiabatic RF pulse shown here is $B_1$-insensitive. Furthermore, a slice selection with high precision is possible with such a pulse.

The echo time TE is now selected such that a strong $T_2$ weighting with simultaneous suppression of background signals is obtained. For this, TE can be extended to 75 ms, for example, advantageously even to a duration between 100 and 200 ms. For example, a very strong $T_2$ weighting is achieved with TE=150 ms. Due to this strong $T_2$ weighting, the echo signal that is subsequently acquired at the adiabatic full-passage pulse 203 is significantly acquired from regions of the examination subject with long $T_2$ relaxation times. Within the scope of a multi-echo magnetic resonance sequence, subsequent refocusing pulses with low flip angles can now be radiated since a strong $T_2$ weighting already exists. Refocusing pulses with a low, variable flip angle are advantageously used for this. The introduction of RF energy into the tissue of the examination subject can thus be minimized.

Figure 3:
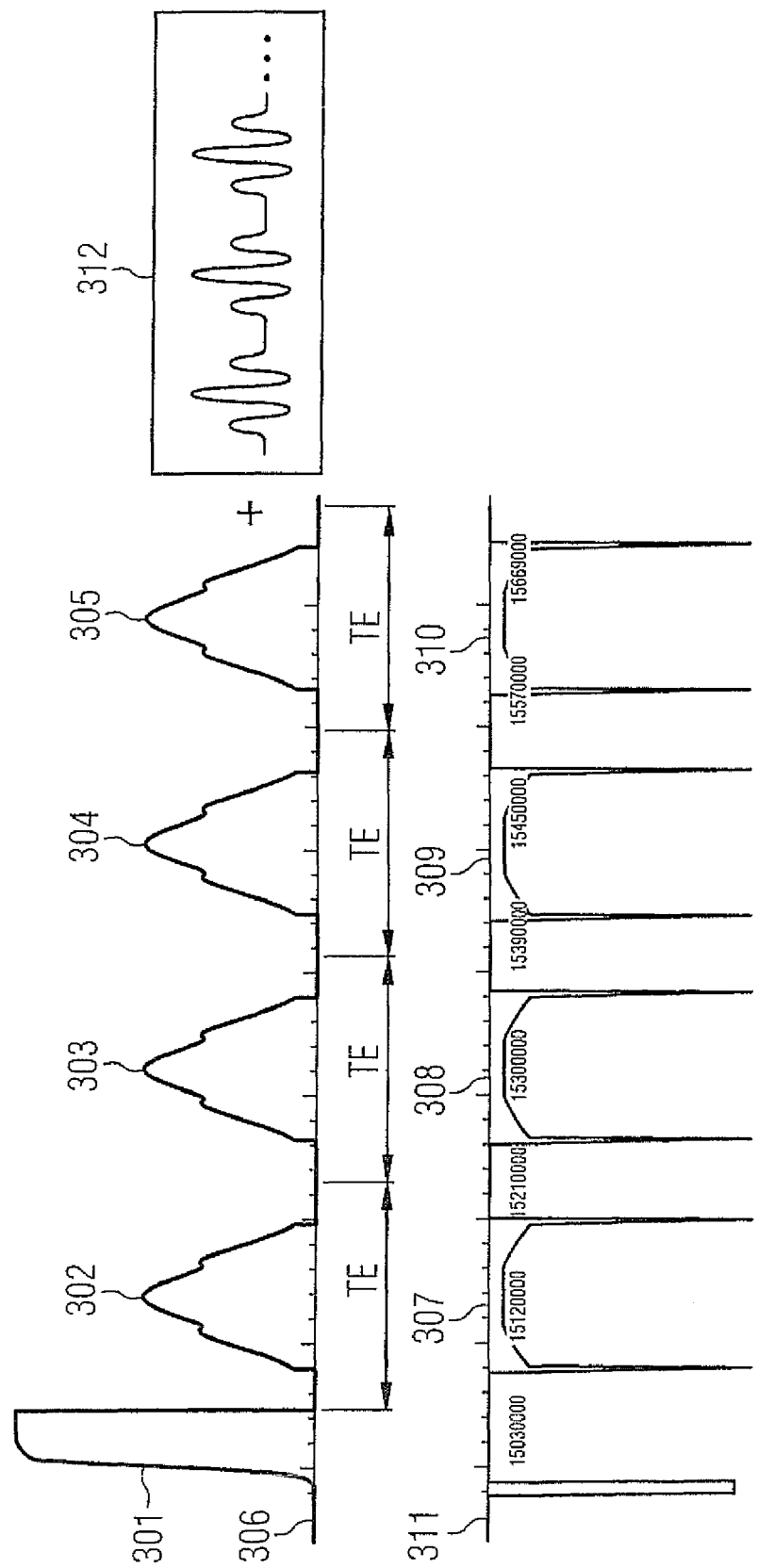
FIG. 3 is a schematic representation of an embodiment of an excitation sequence according to the invention with a subsequent spin echo sequence, wherein the excitation sequence consists of one adiabatic half-passage pulse and four following adiabatic full-passage pulses.

FIG. 3 shows an excitation sequence according to an additional embodiment of the present invention. A strongly $T_2$-weighted, slice-selective excitation is in turn implemented using a $B_1$-insensitive assembled adiabatic excitation pulse. The assembled adiabatic excitation pulse from FIG. 3 includes a non-slice-selective adiabatic half-passage pulse 301. By radiating the AHP pulse 301, a longitudinal magnetization (which is caused by a $B_0$ field, for example) is rotated uniformly in the transverse plane under the adiabatic condition. The properties of the adiabatic excitation pulse lead to the situation that the magnetization is uniformly slewed independent of spatially varying $B_1$ amplitude in the transversal plane, assuming that the effective $B_1$ field slowly changes in comparison to the precession of spins around the effective $B_1$ field. Two identical, selective adiabatic full-passage (AFP) pulses 302 and 303 are subsequently radiated for a slice selection. As already mentioned, a non-linear phase variation across the slice (which is typically induced by the first adiabatic full-passage pulse 302) is compensated by the second AFP phase 303, whereby an essentially constant phase is generated within the slice. Two additional, identically selective AFP pulses 304 and 305 are subsequently radiated. Slice-selection gradients 307, 308, 309 or, respectively, 310 for a slice selection are applied during the radiation of the AFP pulses 302, 303, 304 and 305. These are shown on the slice-selection gradient axis 311. Multi-echo refocusing pulses 312 with variable, low flip angles are radiated subsequent to this assembled excitation sequence. These multi-echo refocusing pulses 312 are only indicated in FIG. 3 and are subsequently described in detail with reference to FIG. 5.

As already mentioned above, these subsequent refocusing pulses are advantageously radiated while satisfying the Carr-Purcell-Meiboom-Gill (CPMG) condition. For this, the orientation of the transversal magnetization coincides with the axis of the refocusing pulses after the first five adiabatic pulses 301-305. In order to achieve such a phase position of the transversal magnetization, the RF phase of the AHP pulse 301 is set. This initial phase with which the AHP pulse 301 should be radiated is calculated via a numerical simulation of the Bloch equations for the AHP pulse. This calculation can ensue in computer 111 from FIG. 1, for example.

The echo time TE between two AFP pulses or, respectively, between the AHP pulse and a spin echo signal is extended in FIG. 3 to approximately 150 ms in order to obtain a strong $T_2$ weighting and to simultaneously suppress background signals. The strong $T_2$ weighting is caused in addition to a spin relaxation between the pulses of a relaxation during the radiation of the adiabatic pulses. The adiabatic pulses therefore generate a much higher $T_2$ weighting than conventional amplitude-modulated pulses.

The data acquisition is advantageously interrupted during the radiation of the adiabatic pulses. Decay signals from areas of the examination subject with short $T_2$ that can still occur during the radiation of the adiabatic excitation pulses are thus not acquired. Given an application of the sequence for MRCP, magnetic resonance signals that originate from tissues of the abdominal region with a wide range of $T_2$ relaxation times are therefore nearly entirely suppressed, for example.

Furthermore, as little RF energy as possible should be introduced into the tissue of the examination subject. In order to achieve this, the AFP pulses and the slice-selection gradients are advantageously modulated according to the VERSE method (Low Energy Variable Rate Selective Excitation). Conolly et al., "Variable-Rate Selective Excitation", Journal of Magnetic Resonance 78, Pages 440-458 (1998) describes details for the implementation of such a modulation. In this method the maximum amplitude of an RF pulse is essentially reduced in that the radiation duration is extended. This compromise between amplitude and time is varied at any point of the pulse. The middle region of an RF pulse generally has a peak amplitude that can thus be reduced while side regions of the pulse can be amplified. The specific absorption rate (SAR) for such a pulse can be significantly reduced via such a redistribution of the area below the RF pulse.

However, the described adiabatic excitation sequence can be implemented not only with VERSE-modulated pulses but also with conventional adiabatic pulses. Adiabatic AHP pulses and AFP pulses are known to those skilled in the art, such that their synthesis need not be described herein in detail.

By using the VERSE modulation, the maximum $B_1$ amplitude of the AFP pulses 302-305 can be significantly reduced, whereby the introduced RF energy and the loading of the RF amplifier are reduced. In order to keep the RF energy low, refocusing pulses are furthermore used that exhibit variable, low flip angles. Suitable flip angles can be calculated using an inverse solution of the Bloch equations with a predetermined, tissue-specific signal development, for example, as is described in Mugler et al., "Practical Implementation of Optimized Tissue-Specific Prescribed Signal Evolutions for Improved Turbo-Spin-Echo Imaging", Proc. Intl. Soc. Mag. Reson. Med. 11 (2003), Page 203. Predetermined signal developments are thereby achieved via radiation of a series of refocusing pulses with continuously variable RF pulse flip angles. The values are calculated using an iterative theoretical simulation that is based on the Bloch equations. The values for the flip angles depend on the relaxation times of a reference tissue and on time parameters for the pulse sequence. The method for calculation of the flip angles is implemented such that the flip angles for a pulse sequence can be calculated quickly based on a parameter selection of a user. Depending on the RF pulse flip angle α, a desired signal is thereby calculated depending on a signal of a pure 180° refocusing pulse, a signal given no RF pulse and the signal of the transversal magnetization.

This equation is subsequently iterated in order to find a solution with the highest total signal. Secondary conditions for the flip angle values are thereby established at selected positions along the echo sequence in order to control the energy introduction. A sequence of refocusing pulses with variable flip angles is thus obtained that delivers a maximum total signal but is linked with only a low RF energy introduction.

A signal progression that is suitable for CRMP comprises, for example, an exponential decrease in the first 70% of the progression and a constant level in the remainder of the progression. This progression generates sufficiently high flip angles at the start of the echo sequence, wherein the flip angles are reduced up to a specific region of the echo sequence and finally rise again gradually in the remainder of the echo sequence.

Figure 5:
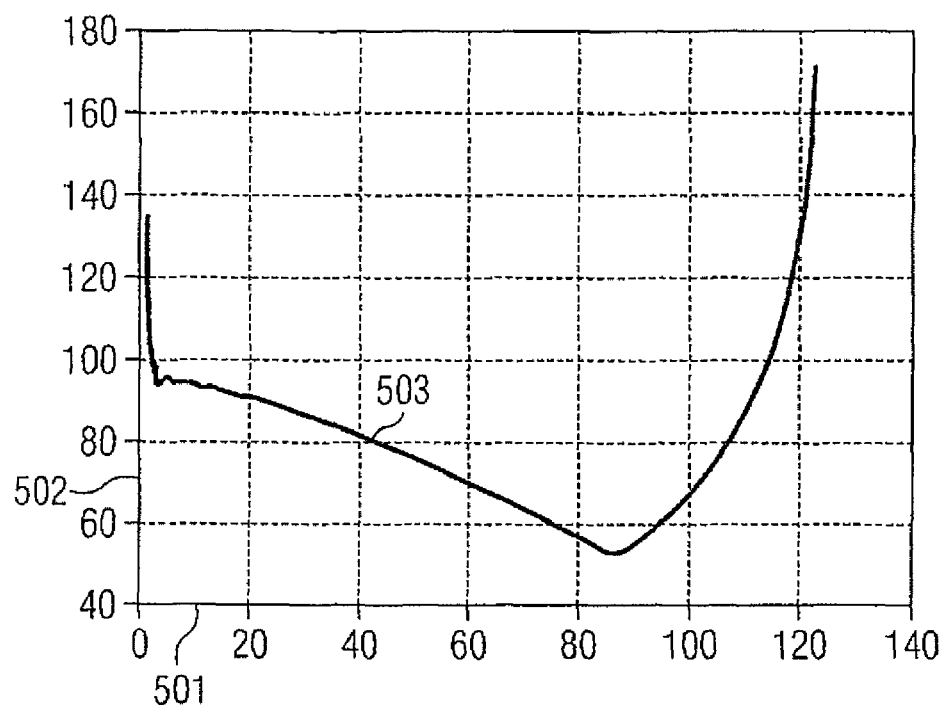
FIG. 5 is a diagram of a possible variation of the flip angle of refocusing pulses over the course of a spin echo sequence.

Such a situation is shown in FIG. 5. The RF pulse number is plotted on axis 501. Axis 502 shows the flip angle in degrees. The exemplary progression of the flip angle over the sequence of refocusing pulses initially shows an exponential decline at the start of the sequence, subsequently low flip angles over a wide range of the sequence, and finally flip angles rising again at the end of the sequence. As shown, the flip angles are generally quite low so that the energy introduction into the tissue of the examination subject is minimized. In this example the flip angle is less than 100° for the majority of the RF refocusing pulses. It is advantageous when the flip angle is less than 120° for at least half of the refocusing pulses, advantageously is less than 100°.

In order to achieve an additional reduction of the energy introduction, a partial Fourier acquisition in the phase coding direction can be used, for example. Approximately between 50 and 60% of k-space or half of k-space is filled with data with such an acquisition, for example.

The remainder of the data of the opposite side is calculated from existing k-space data. Given a uniform spatial resolution, a faster data acquisition can therefore be achieved. These techniques, what are known as half-Fourier/half-scan techniques, are known and therefore need not be described in detail here.

Furthermore, the central lines of k-space are advantageously acquired at the beginning of the sequence of the refocusing pulses. A $B_1$ insensitivity can thus be additionally improved. Although $B_1$ inhomogeneity effects can occur in the refocusing pulse sequence can occur, the central region of k-space is less affected by such changes in the $B_1$ amplitude. The $B_1$ insensitivity is thus improved.

Figure 4:
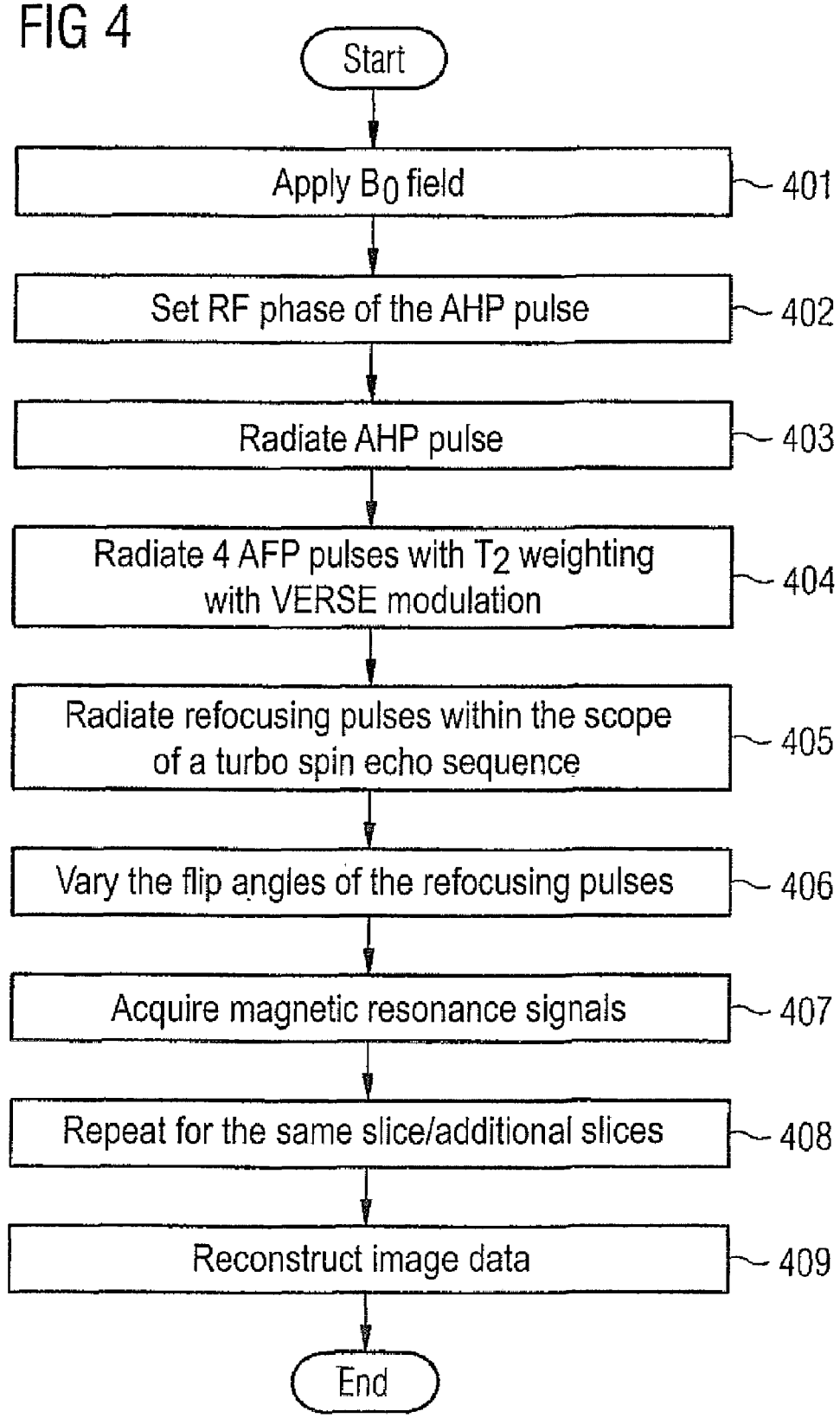
FIG. 4 is a flowchart of an embodiment of the method according to the invention for generation of an excitation in an examination subject for acquisition of magnetic resonance signals.

FIG. 4 shows a flow diagram of an embodiment of the method according to the invention. Prepared steps, for example the positioning of an examination subject in the magnet of a magnetic resonance system, are not shown in FIG. 4; however, such steps are known to a man skilled in the art and he knows how he has to execute those. In FIG. 4, a $B_0$ field is applied in a first Step 401, for example with a magnet 101 of the magnetic resonance system 100. In a next Step 402, an adjustment of the RF phase ensues for an AHP pulse that should be radiated to generate an excitation in a region of the examination subject. As already mentioned, the RF phase is based on a numerical simulation such that a CPMG condition can subsequently be satisfied. The AHP pulse is radiated into a region of the examination subject in Step 403, wherein essentially a $B_1$-insensitive excitation of a transversal magnetization results in this region. In a next Step 404, four AFP pulses with strong $T_2$ weighting are radiated. As described in the preceding, the four AFP pulses are modulated with the VERSE method. The AFP pulses are radiated in a slice-selective manner, i.e. with application of a slice-selection gradient. After the radiation of the four AFP pulses, magnetic resonance signals are acquired essentially from only regions of the applied slice of the examination subject that exhibit a long $T_2$ relaxation time. Refocusing pulses for generation of spin echo signals are subsequently radiated (Step 405). Such a pulse sequence can correspond to a turbo spin echo sequence with the previously described adiabatic excitation, for example. However, it is also conceivable to use other multi-echo magnetic resonance sequences in order to acquire magnetic resonance signals with high $T_2$ weighting. For example, a gradient echo sequence can be used instead of a turbo spin echo sequence.

In the example of FIG. 4, the flip angles of the refocusing pulses are varied over the course of the spin echo sequence (Step 406). Small flip angles are thereby advantageously used so that the RF energy introduced into the examination subject can be reduced. Furthermore, an acquisition of magnetic resonance signals ensues in Step 407 during the radiation of the refocusing pulses. These magnetic resonance signals are spin echo signals that are induced by a rephasing of the transversal magnetization caused by the refocusing pulses. For example, these can be acquired with RF unit 107 and be stored or processed in computer 111.

Steps 402-407 are repeated for the same slice and/or for additional slices (Step 408). This means that, according to Step 407 (in which magnetic resonance signals are acquired from one slice), an excitation of another slice can ensue again in Step 403, wherein this ensues via variation of the slice-selection gradients in Step 404. Magnetic resonance signals can thus be acquired from a plurality of slices. Finally, the reconstruction of image data from acquired magnetic resonance signals ensues in Step 409. For example, this can ensue via a 2D Fourier transformation of the magnetic resonance k-space data. 3D reconstructions can likewise be calculated from 2D slice images.

The method described with reference to FIG. 4 can include additional steps, in particular the steps that are generally implemented for an acquisition of magnetic resonance signals from a slice of an examination subject. For example, the application of phase coding gradients, the application of frequency coding gradients and the application of what are known as spoiler gradients could among these. It should also be clear that more or fewer AFP pulses can be radiated, for example.

Figure 6:
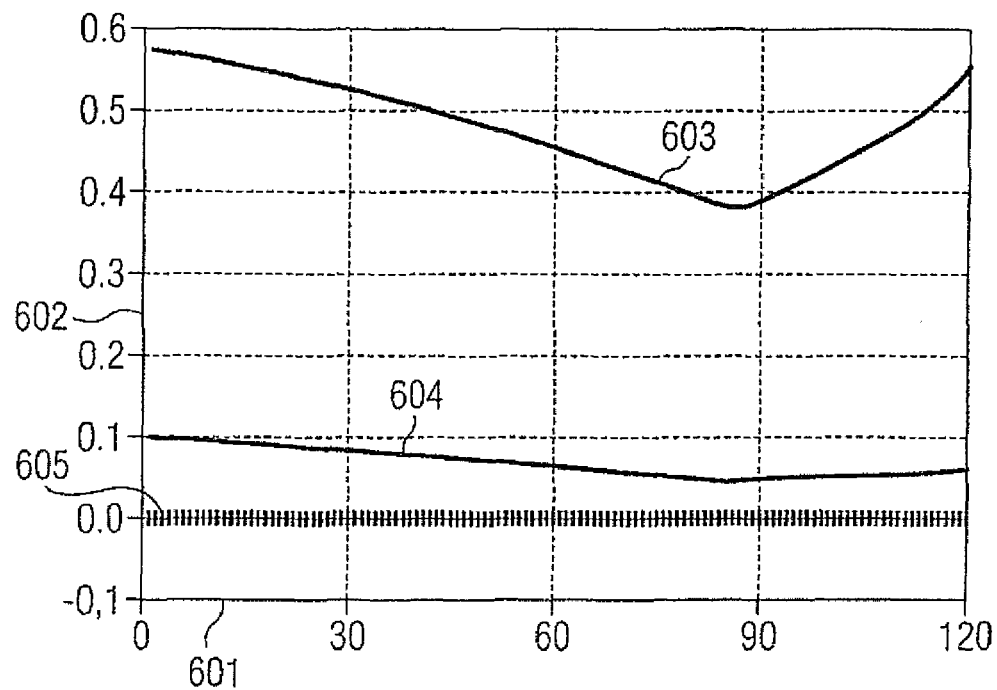
FIG. 6 shows an example of magnetic resonance signals of various regions of an examination subject that were acquired over the course of a spin echo sequence.

FIG. 6 schematically shows exemplary curves of magnetic resonance signals that were acquired with a multi-echo sequence that follows one of the assembled excitation sequences described in the preceding. Axis 601 thereby indicates the refocusing pulse number, in contrast to which axis 602 indicates a signal intensity in arbitrary units. The signal 603 is the signal of fluid (for example fluid of the bile duct system); signal 604 is the signal of blood; and signal 605 is that of adipose tissue. The signal curve from FIG. 6 was obtained in that the flip angles of the refocusing pulses were varied according to the curve in FIG. 5. The assembled adiabatic excitation sequence with one AHP pulse and four AFP pulses that was shown in FIG. 3 was used for excitation. A strong $T_2$ weighting was thereby obtained by setting the echo time between 100 and 200 ms, advantageously between 120 and 180 ms. As is apparent from FIG. 6, the use of such an excitation sequence together with the use of refocusing pulses with variable flip angles leads to the situation that significantly greater magnetic resonance signals of fluid are obtained in comparison to magnetic resonance signals from blood and fat. This is achieved even though only a small energy introduction into the examination subject ensues due to the reduced flip angles. Both a high contrast between the fluid with long $T_2$ relaxation time and other regions of the examination subject is thus obtained via the described method, and an introduction of RF energy is minimized.

In summary, it is to be noted that a strong $T_2$ weighting and a fast, complete background signal suppression that are required for MRCP imaging are achieved by using the five adiabatic excitation pulses that use a longer echo time in an exemplary embodiment of the present invention, wherein an additional improvement is achieved in that the data acquisition is only started after the radiation of the excitation sequence. Furthermore, with such an excitation sequence separate sequence-selective RF pulses are not necessary in order to achieve a fat suppression. This is enabled due to the strong $T_2$ weighting. Furthermore, the introduced RF energy is reduced by using the VERSE modulation of the RF pulses as well as via the use of variable, low refocusing flip angles. $B_1$ insensitivity is furthermore achieved both by using adiabatic excitation pulses and via the acquisition of the k-space center at the beginning of the refocusing pulse sequence. The described method therefore achieves an improved background signal suppression (fat, blood, liver etc.), a $B_1$-insensitive $T_2$ weighting and reduced energy introduction into tissue of the examination subject in comparison to conventional methods. The method is therefore in particular suitable for MRCP imaging.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for exciting nuclear spins in an examination subject for acquiring magnetic resonance signals from a region of the examination subject, comprising the steps of:
    placing an examination subject in a static, homogenous, basic magnetic field;
    irradiating the subject in the basic magnetic field with an adiabatic half-passage (AHP) pulse to generate transverse magnetization in the examination subject;
    irradiating the examination subject in the basic magnetic field with at least a first adiabatic full-passage (AFP) pulse and a second AFP pulse to generate slice-selective re-phasing of the transverse magnetization;
    setting a time interval between said AHP pulse and said first adiabatic AFP pulse to be at least 37 ms, and setting a time interval between said first AFP pulse and said second AFP pulse to be at least 75 ms, the irradiation of the examination subject with said AHP pulse and said at least first and second AFP pulses causing excitation of nuclear spins in a region of the examination subject that result in generation of magnetic resonance signals; and
    detecting said magnetic resonance signals and entering the detected magnetic resonance signals in an electronic raw data file in a form allowing generation of a magnetic resonance image of the region of the examination subject therefrom.

2. A method as claimed in claim 1 comprising after irradiating said second AFP pulse, irradiating the examination subject in the basic magnetic field with at least a third AFP pulse and a fourth AFP pulse, and setting a time interval between said second AFP pulse and said third AFP pulse to be at least 75 ms and setting a time interval between said third AFP pulse and said fourth AFP pulse to be at least 75 ms.

3. A method as claimed in claim 2 comprising setting the time interval between any successive two of said AFP pulses to be at least 100 ms.

4. A method as claimed in claim 2 comprising setting the time interval between any successive two of said AFP pulses to be at least 150 ms.

5. A method as claimed in claim 1 comprising setting said time interval between any successive two AFP pulses to satisfy a condition that the transverse magnetization after irradiation of a last of the AFP pulses has substantially decayed in regions of the examination subject primarily comprised of tissue, compared to transverse magnetization rephasing in regions of the examination subject primarily comprised of fluid, to allow spin echo magnetic resonance signals, as said magnetic resonance signals, to be acquired from the regions of the examination subject primarily comprised of fluid.

6. A method as claimed in claim 1 comprising:
    in a processor, automatically calculating a phase of the transverse magnetization excited by the AHF pulse using a mathematical description of the AHF pulse; and
    in said processor, adjusting an RF phase of the AHF pulse using the calculated phase of the transverse magnetization to cause a predetermined phase of the transverse magnetization to exist in the examination subject after irradiation of the examination subject with the AHP pulse and the AFP pulses.

7. A method as claimed in claim 1 comprising modulating the radiated AFP pulses according to a VERSE method.

8. A method as claimed in claim 1 comprising implementing no acquisition of said magnetic resonance signals for imaging during irradiation of the AHP pulse and the AFP pulses.

9. A method as claimed in claim 1 comprising:
    successively irradiating the examination subject with multiple refocusing pulses to generate a rephasing of the transverse magnetization; and
    acquiring spin echo magnetic resonance signals, as said magnetic resonance signals, between successive ones of said refocusing pulses.

10. A method as claimed in claim 9 comprising setting a phase, selected from the group consisting of a phase of the refocusing pulses and a phase of the AHF pulse, to satisfy a CPMG condition.

11. A method as claimed in claim 9 comprising irradiating the refocusing pulses in a spin echo sequence with predetermined flip angles that cause a stewing of the transverse magnetization, and setting said flip angle to change according to predetermined values within a duration of the spin echo sequence.

12. A method as claimed in claim 11 comprising setting the flip angles of at least half of said refocusing pulses irradiated in the spin echo sequence to be less than 120°.

13. A method as claimed in claim 11 comprising setting the flip angles of at least half of said refocusing pulses irradiated in the spin echo sequence to be less than 100°.

14. A method as claimed in claim 11 comprising, in a processor, calculating values for said flip angles using an inverse solution of a Bloch equation and from relaxation times for a reference tissue, to maximize said magnetic resonance signals, and limiting values for the flip angles for predetermined refocusing pulses to predetermined maximum values.

15. A method as claimed in claim 11 comprising setting values for the respective flip angles that decay exponentially within a duration of the spin echo sequence for a predetermined number of refocusing pulses, and maintaining a predetermined value of the flip angles, or increasing the flip angled to a predetermined value, for a predetermined number of subsequent refocusing pulses.

16. A method as claimed in claim 9 comprising acquiring the spin echo magnetic resonance signals in a phase coding direction with a partial Fourier acquisition.

17. A method as claimed in claim 9 comprising entering said spin echo magnetic resonance signals into k-space to form said data file, and entering said magnetic resonance signals into central k-space lines following the excitation with said AHP pulse and said AFP pulses.

18. A method as claimed in claim 1 comprising irradiating said AFP pulse and said AFP pulses in a magnetic resonance imaging sequence selected from the group consisting of magnetic resonance imaging sequences designed to image a fluid, and cholangiopancreaticography magnetic resonance imaging sequences.

19. A magnetic resonance imaging system for exciting nuclear spins in an examination subject and for acquiring magnetic resonance signals from a region of the examination subject comprising:
    a magnetic resonance data acquisition unit that generates a static, homogenous, basic magnetic field in which an examination subject is disposed;

an RF system;

a control unit configured to operate the RF system to irradiate the subject in the basic magnetic field with an adiabatic half-passage (AHP) pulse to generate transverse magnetization in the examination subject;

said control unit being configured to also operate the RF system to irradiate the examination subject in the basic magnetic field with at least a first adiabatic full-passage (AFP) pulse and a second AFP pulse to generate slice-selective re-phasing of the transverse magnetization;

said control unit being configured to set a time interval between said AHP pulse and said first adiabatic AFP pulse to be at least 37 ms, and setting a time interval between said first AFP pulse and said second AFP pulse to be at least 75 ms, the irradiation of the examination subject with said AHP pulse and said at least first and second AFP pulses causing excitation of nuclear spins in a region of the examination subject that result in generation of magnetic resonance signals; and said control unit being configured to operate the RF system to detect said magnetic resonance signals and to enter the detected magnetic resonance signals in an electronic raw data file in a form allowing generation of a magnetic resonance image of the region of the examination subject therefrom.

20. A non-transitory computer readable medium encoded with programming instructions that, when loaded into a control unit of a magnetic resonance imaging system having a static, homogenous basic magnetic field in which an examination subject is disposed, cause said magnetic resonance imaging system to operate to:

irradiate the subject in the basic magnetic field with an adiabatic half-passage (AHP) pulse to generate transverse magnetization in the examination subject;

irradiate the examination subject in the basic magnetic field with at least a first adiabatic full-passage (AFP) pulse and a second AFP pulse to generate slice-selective re-phasing of the transverse magnetization;

set a time interval between said AHP pulse and said first adiabatic AFP pulse to be at least 37 ms, and set a time interval between said first AFP pulse and said second AFP pulse to be at least 75 ms, the irradiation of the examination subject with said AHP pulse and said at least first and second AFP pulses causing excitation of nuclear spins in a region of the examination subject that result in generation of magnetic resonance signals; and detect said magnetic resonance signals and enter the detected magnetic resonance signals in an electronic raw data file in a form allowing generation of a magnetic resonance image of the region of the examination subject therefrom.

* * * * *